United States Patent
Holman et al.

(10) Patent No.: US 9,065,410 B2
(45) Date of Patent: Jun. 23, 2015

(54) AUTOMATIC AUDIO EQUALIZATION USING HANDHELD MODE DETECTION

(75) Inventors: Tomlinson M. Holman, Yucca Valley, CA (US); Aram M. Lindahl, Menlo Park, CA (US)

(73) Assignee: Apple Inc., Cupertino, CA (US)

( * ) Notice: Subject to any disclaimer, the term of this patent is extended or adjusted under 35 U.S.C. 154(b) by 291 days.

(21) Appl. No.: 13/536,849

(22) Filed: Jun. 28, 2012

(65) Prior Publication Data

US 2014/0003626 A1    Jan. 2, 2014

(51) Int. Cl.
| | | |
|---|---|---|
| *H04M 1/00* | (2006.01) | |
| *H03G 5/00* | (2006.01) | |
| *H03G 5/16* | (2006.01) | |
| *H04S 7/00* | (2006.01) | |

(52) U.S. Cl.
CPC ............... *H03G 5/005* (2013.01); *H03G 5/165* (2013.01); *H04S 7/302* (2013.01); *H04S 7/307* (2013.01); *H04R 2499/11* (2013.01)

(58) Field of Classification Search
CPC .................................................. H04M 2250/12
USPC ........................................ 381/103; 455/569.1
See application file for complete search history.

(56) References Cited

U.S. PATENT DOCUMENTS

| | | | |
|---|---|---|---|
| 8,473,011 B2 * | 6/2013 | Simmons et al. ........... | 455/569.1 |
| 2004/0259591 A1 * | 12/2004 | Grams et al. ............... | 455/556.1 |
| 2006/0104451 A1 | 5/2006 | Browning et al. | |
| 2009/0103744 A1 | 4/2009 | Klinghult et al. | |
| 2010/0318205 A1 | 12/2010 | Ohkuri et al. | |
| 2013/0260834 A1 * | 10/2013 | Ingalls .......................... | 455/566 |

FOREIGN PATENT DOCUMENTS

| | | |
|---|---|---|
| WO | WO 2011/011438 A2 | 1/2011 |
| WO | WO 2011/110901 A1 | 9/2011 |

* cited by examiner

*Primary Examiner* — Alexander Jamal
(74) *Attorney, Agent, or Firm* — Blakely, Sokoloff, Taylor & Zafman LLP

(57) ABSTRACT

A portable audio device that includes a motion sensor, an audio equalizer, a speaker, and a context detector. The motion sensor detects general motion, movement, or acceleration of the device and outputs a series of momentary measurements. The context detector receives these momentary measurements and determines whether the portable audio device is being held in the hand of a user. Upon determining that the device is being held in the hand of user, the audio equalizer performs upward tilt equalization on an audio signal being played by the device through the speaker. Upon determining that the device is not being held in the hand of user (e.g. it is lying flat and still on a surface), the audio equalizer performs downward tilt equalization on the audio signal. Other embodiments are also described.

26 Claims, 4 Drawing Sheets

AUTOMATIC AUDIO EQUALIZATION USING HANDHELD MODE DETECTION

FIELD

An embodiment relates to a mobile communications device that adjusts audio equalization of an audio signal based on detecting whether the device is being held in the hand of a user or is not being held in the hand of a user (e.g. lying flat on a surface). Other embodiments are also described.

BACKGROUND

Portable audio devices such as mobile phones and smartphones can be used to play back or stream audio in various contexts. During a phone call for example, the device housing may be held against the user's ear. In speakerphone mode, the user may hold the housing in her hand away from her ear, or she may wish to place the device on a table. The device could also be attached to or resting on a stand on an edge or at an angle relative to the table.

SUMMARY

Portable devices can output audio through one or more integrated speakers. The apparent quality and characteristics of audio output by an integrated speaker is often affected by surrounding objects and the positioning of the device. It has been found that when a portable device is placed flat on a table, sound emitted from an "edge firing" integrated speaker tends to sound "bright" in comparison to when the same sound is emitted while the device is held in the hand of a user. This change in sound characteristics may be the result of sound wave diffraction, reflection off nearby surfaces, reverberation, and similar deformations. As a result, sound emitted by an integrated speaker of a portable device is often inconsistent across different use contexts.

A portable audio device is described that adjusts audio equalization of an audio signal based on the use context of the device.

An embodiment of the invention is a portable audio device, e.g. a mobile phone, a tablet computer, a notebook computer, a headset, or other electronic sound producing device that includes a motion sensor, an audio equalizer, a speaker, and a context detector. The motion sensor detects general motion, movement, or acceleration of the device and outputs a series of momentary measurements. The context detector receives these momentary measurements and analyzes them to determine whether the device is being held in the hand of a user. In one embodiment the context detector may detect, based on the momentary measurements, involuntary motions of the hand even when the user attempts to hold the device still. Upon determining that the device is being held in the hand of the user, the audio equalizer performs upward tilt equalization on an audio signal that is to be or is being played by the device through the speaker. This determination may perhaps be also based on or informed by inputs from other sensors such as a touch sensor, an inclinometer, or a magnetic field sensor. Upon determining that the device is not being held in the hand of the user (e.g. it may be lying still and flat on a fixed surface or slightly inclined on a surface), audio equalizer performs downward tilt equalization on the audio signal. By detecting the context or positioning of the device by its user, and applying audio equalization accordingly, audio emitted by the device through the speaker is more consistent and more accurately represents the audio signal across different use contexts.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Several embodiments are described with reference to the appended drawings are now explained. While numerous details are set forth, it is understood that some embodiments of the invention may be practiced without these details. In other instances, well-known circuits, structures, and techniques have not been shown in detail so as not to obscure the understanding of this description.

Figure 1A:
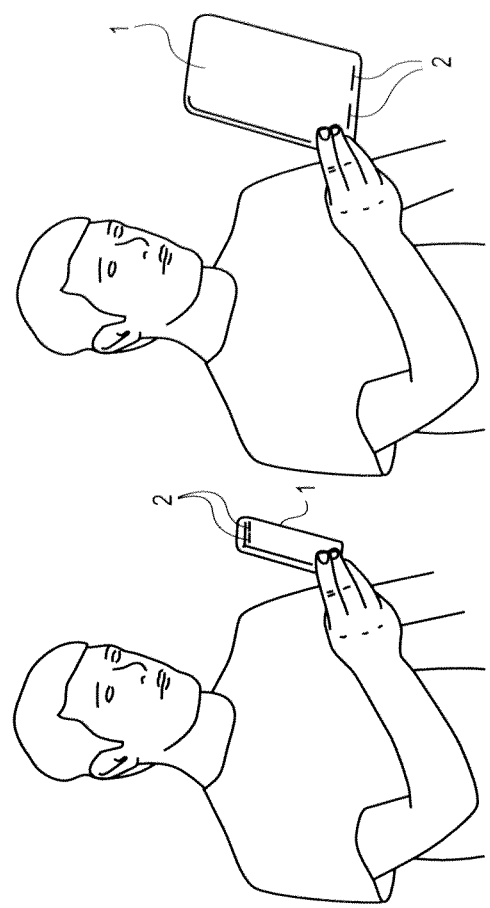
FIG. 1A shows two instances of a multi-function portable audio device held in the hands of an end user.

FIG. 1A shows two instances of a multi-function portable audio device 1 (e.g. a mobile communications device) held in the hands of an end user (owner) of the device 1. In one instance, the device 1 is a smart phone or a cellular phone with several features typically available in modern wireless communication devices, such as a touch screen interface, music, video file recording, playback, digital camera, and wireless-enabled applications such as voice over internet protocol telephony, electronic calendar, web browser, and email. In another instance, the device 1 may be a larger, tablet-like computer such as an iPad® device by Apple Inc.

Figure 1B:
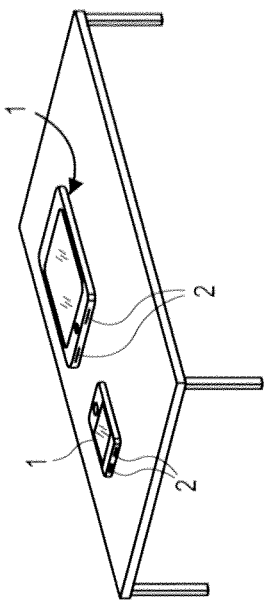
FIG. 1B shows the devices lying flat on a table surface.

The portable audio device 1 includes one or more speakers 2 for outputting audio. The speaker 2 may be an integrated general speaker such as a built-in or directly attached but removable loud speaker, e.g. a speaker phone unit of a mobile phone, or a detachable speaker module. As shown in FIG. 1A, the speakers 2 are on the rear surface of each device 1. In other embodiments, the speakers 2 may be on the front surface, edges, or another location on the device 1. FIG. 1B shows the devices 1 lying flat on a table surface. In this embodiment, the speakers 2 are side-firing, i.e. their outputs are located on the edges of the device 1 (rather than its top or bottom faces). In all these cases, the speaker 2 may be powered by, or driven by, an audio power amplifier that is integrated in the housing of the portable audio device 1.

Figure 2:
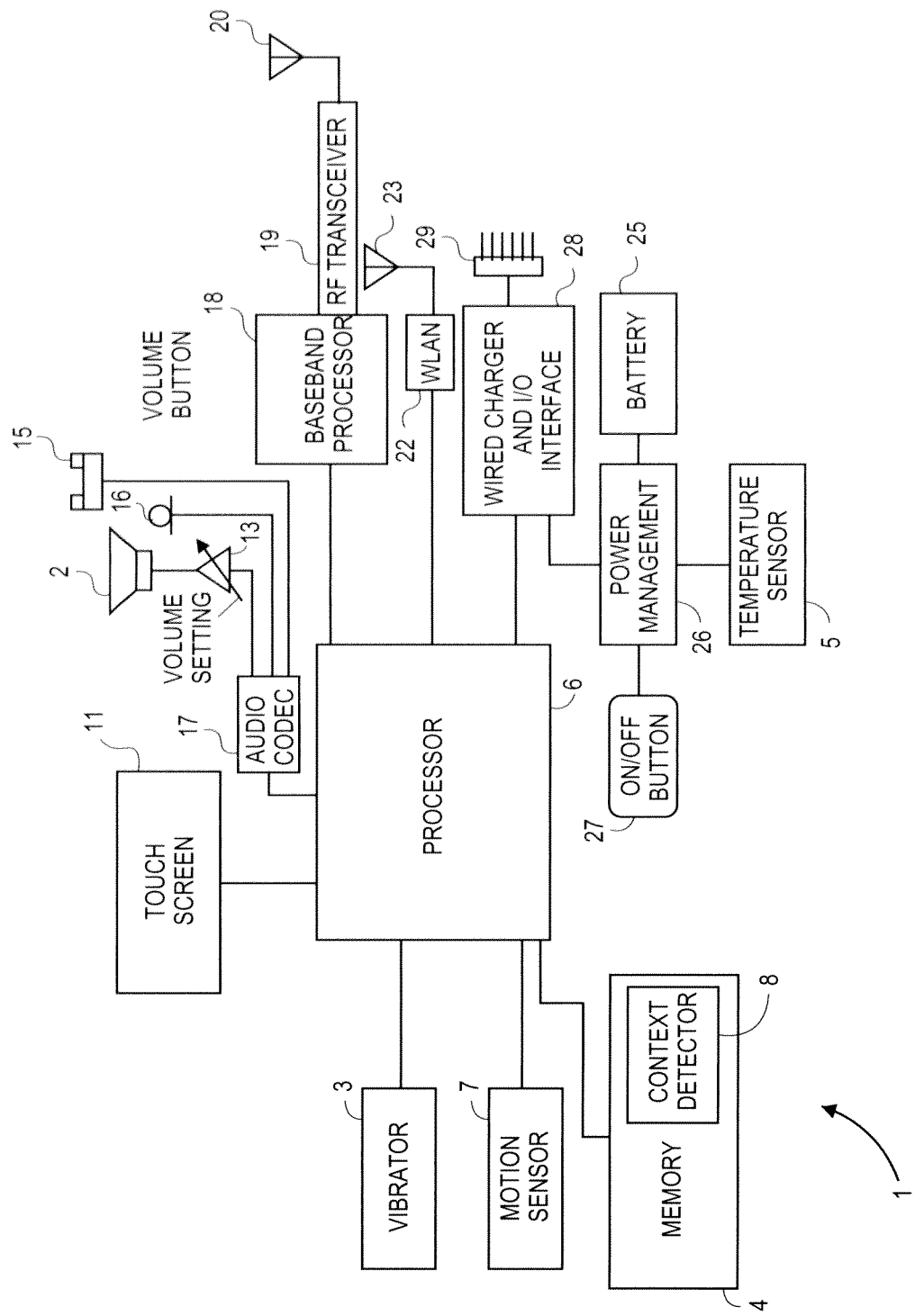
FIG. 2 shows a functional unit block diagram and some constituent hardware components of the multi-function portable audio device.

FIG. 2 shows a functional unit block diagram and some constituent hardware components of the portable audio device 1, e.g. as found in an iPhone® device by Apple Inc. Although not shown, the device 1 has a housing in which the primary mechanism for visual and tactile interaction with its user is a touch sensitive display screen (referred to here as a touch screen) 11. The housing may be essentially a solid volume referred to as candy bar or chocolate bar type as in the iPhone device. An alternative is one that has a moveable, multi-piece housing, such as a clamshell design, or one with a sliding, physical keypad as used by other cellular and mobile handset or smart phone manufacturers. The touch screen 11 is used to display typical features of visual voicemail, web browser, email, and digital camera viewfinder, as well as others, and to receive input from the user via virtual buttons and touch commands.

For wireless telephony, which enables the user to receive and place audio and/or video calls, downlink audio during a call can be emitted from the speakers 2. Uplink audio includes the user's speech, which is picked up by a microphone 16 (e.g., mouthpiece microphone or headset microphone). Conversion between analog domain and digital domain for the speaker and microphone signals, in addition to digital audio signal processing for different applications running in the device 1, may be performed within audio codec 17. In one embodiment, the microphone 16 outputs a digital signal. In this embodiment, the audio codec 17 does not need to perform analog-to-digital conversion on the signal. However, the codec 17 may perform other operations on the digital signal output by the microphone. A physical volume switch or button 15 may also be connected to the codec. As shown, the power amplifier 13 is connected to the speaker 2 and amplifies an audio signal according to a volume setting. The codec 17 may be configured to operate in different modes, e.g. to service a digital media player function (such as an MP3 player that is playing back a music file that is stored in the device 1), as well as a wireless telephony function. In one embodiment, the audio codec 17 performs audio equalization on an audio signal prior to being sent to speakers 2. In one embodiment, the audio codec 17 may include an audio equalizer that adjusts the tone or frequency response of an audio signal. This adjustment may be performed by applying different levels of gain to selective areas of the audio signal. For example, the audio equalizer may apply upward or downward equalization to an audio signal. The audio equalization may be performed in the digital domain, using digital filters, or it may be performed in the analog domain using analog filters located in front of the audio power amplifier 13.

For wireless telephony, a baseband processor 18 is included to perform speech coding and decoding functions upon the uplink and downlink signals, respectively, in accordance with the specifications of a given protocol, cellular GSM, cellular CDMA, wireless VOIP. A cellular RF transceiver 19 receives the coded uplink signal from the baseband processor and up converts it to a carrier band before driving an antenna 20 with it; it receives a downlink signal from the antenna 20 and down converts the signal to baseband before passing it to the baseband processor 18. A wireless local area network transceiver 22 receives and transmits data packets from a nearby wireless router or access point, using an antenna 23.

Power is provided to operate the components shown in FIG. 2 by a battery 25 (generically used here to refer to a rechargeable power source that may also include a rechargeable fuel cell). The battery 25 is charged or replenished by an external power source such as a wall plug or automobile battery dc power adapter (not shown) that connects to a multipin docking connector 29 that is also integrated in the housing of the device 1. The connector 29 and its associated charger and I/O interface circuitry 28 may be in accordance with any suitable computer peripheral specification such as Universal Serial Bus (USB). The USB protocol allows for the connector 29 and its associated interface 28 to be used for both power transfer to recharge the battery 25 and for data I/O communications. The latter includes docking functions, to synchronize user content in the device 1 with another computer device owned by the user that may have substantially more data storage capacity, e.g. a desktop computer, a laptop/notebook computer. In other embodiments, the device 1 includes components for wireless inductive charging in which an electromagnetic field transfers energy between a charger and the device 1 without a wired connection between the charger and the device 1.

The personal portable audio device 1 may include a power management unit (PMU) 26. The PMU 26 is typically implemented as a programmed processor, with associated analog and digital conversion circuitry, analog signal conditioning circuitry, and a data communications interface needed to control or communicate with other components of the device 1 (for purposes thermal management). The PMU 26 obtains temperature data (or temperature readings) from multiple temperature sensors 5, and then processes that data to make decisions that affect power consumption activity, in order to maintain specified thermal levels for the device 1. The PMU 26 may include power supply circuitry with various regulated voltage outputs for supplying power to the components of the device 1 including the integrated audio power amplifier 13. The PMU 26 may also be tasked with the orderly powering down and powering up the various components of the device 1, in response to system reset or the main power on/off switch 27 being actuated by the user.

The device 1 also includes a motion sensor 7 which may include an accelerometer to measure linear acceleration of the device 1 along a given axis. Motion sensor 7 may, in addition or as an alternative, include other types of mechanical force sensors, such as gyroscopes to measure turn rate or angular velocity of the device 1 about a given axis, and/or a magnetic field sensor. One or more of such sensors are to be used here to measure and analyze the vibrations of the device 1 in order to determine which "use context" the portable device 1 finds itself in.

The user-level functions of the device 1 are implemented under control of a processor 6 that has been programmed in accordance with instructions (code and data) stored in memory 4. The processor 6 and memory 4 are generically used here to refer to any suitable combination of programmable data processing components and data storage that conduct the operations needed to implement the various functions of the device 1. The processor 6 may be an applications processor typically found in a smart phone, while the memory 4 may refer to microelectronic, non-volatile random access memory. An operating system may be stored in the memory 4, along with application programs specific to the various functions of the device, which are to be run or executed by the processor 6 to perform the various functions of the device 1. For instance, there may be a telephony application that (when launched, unsuspended, or brought to foreground) enables the user to "dial" a telephone number to initiate a telephone call using a wireless VOIP or a cellular protocol and to "hang up" on the call when finished. A context detector 8 as a firmware or software module or program may be stored, to determine the use context of the device 1.

The motion sensor 7 of device 1, shown in FIG. 2, is an available device within mobile communications device 1 that is available to detect general motion, movement, or acceleration of the device 1. The motion sensor 7 may be an accelerometer, a gyroscope, or an inclinometer. The motion sensor 7 may be programmed to detect and record motion at various sample rates. For example, the motion sensor 7 may operate at a sample rate of 500 Hz while the device 1 is in a normal mode, with valid data up to nearly 250 samples per second using the sampling theorem that says that waveform construction is accurate up to just under ½ the sample rate. In other modes (such as a test mode), the motion sensor 7 may operate at a 1 kHz sampling rate, with valid data up to nearly 500 samples per second using the sampling theorem. As part of the sensor readout operation, a smoothing function may be applied to a short sequence of raw output values from the motion sensor 7 to obtain a single, representative value. For instance, the actual output data that is evaluated or used in a subsequent operation below may be an average of several samples taken from the motion sensor 7, so as to smooth out the effects of noise in instantaneous readings from the motion sensor 7, or to ensure that the raw values are reasonably stable before using them.

Still referring to FIG. 2, the context detector 8 may be a program module that determines or detects whether the portable audio device 1 is being held in the hand of a user or lying still on a fixed surface. In one embodiment, the context detector 8 may alternatively be implemented as hardwired logic circuitry integrated in the portable audio device 1. The control circuitry may include one or more of the processor 6, the memory 4, and a set of hardware logic structures (e.g. filters, arithmetic logic units, dedicated state machines, and Fast Fourier Transform processors).

In one embodiment, the context detector module 8 detects whether the portable audio device 1 is being held in the hand of a user (see FIG. 1A) or whether it is lying flat on a surface (see FIG. 1B), based on outputs of the motion sensor 7 and possibly other sensors (e.g. an inclinometer). In one embodiment, the context detector module 8 receives a predetermined number of momentary measurements from the motion sensor 7. A frequency transformation may be performed on the momentary measurements to determine a frequency of vibration of the portable audio device 1. When held in the hand of a user, the device 1 vibrates based on involuntary motions of the hand even when the user attempts to hold the device 1 still. In one embodiment, the frequency transformation of the momentary measurements from the motion sensor 7 may be generally similar to the magnitude vs. frequency graph shown in FIG. 3A. Representatively, a Fast Fourier Transform (FFT) of the sampled sensor output data may be performed to obtain a frequency spectrum of the sensed vibrations in the device 1.

Figure 3A:
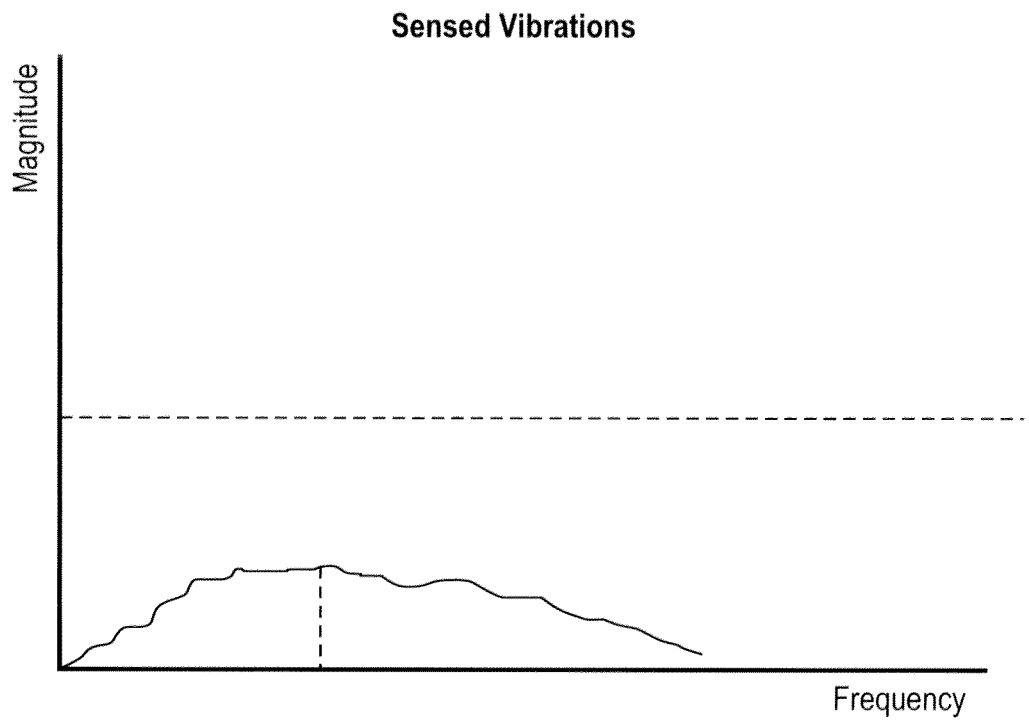
FIG. 3A is a frequency domain representation of vibrations sensed in the portable audio device while the device is lying flat on a surface or otherwise not being held in the hand of the user.

As shown in FIG. 3A, the motion and vibrations of the device 1 are represented in a magnitude/frequency graph. Although the entire frequency spectrum is shown in FIG. 3A, the context detector module 8 may only examine a specific component or range of the frequency spectrum. For example, the context detector module 8 may analyze only the 10 Hz to 20 Hz range when determining if the device 1 is being held in the hand of a user.

In one embodiment, the context detector module 8 determines that the device is being held in the hand of a user by comparing a peak in the frequency spectrum or a range of the frequency spectrum to a predetermined level. The predetermined level may be fixed or calculated periodically by the device 1. For example, the predetermined level may be calculated during a calibration routine run on the device 1.

In one embodiment, if the detected peak in the frequency spectrum is greater than or equal to the predetermined level, the context detector module 8 determines that the vibrations are significant enough to indicate that the device 1 is being held in the hand of a user. If the peak in the frequency spectrum is less than the predetermined level, the context detector module 8 determines that the device 1 is lying steady on a surface or otherwise not being held in the hand of a user. As noted above, the analysis may be limited to a specific range in the frequency spectrum such that the peak must be present in the limited frequency range.

Figure 3B:
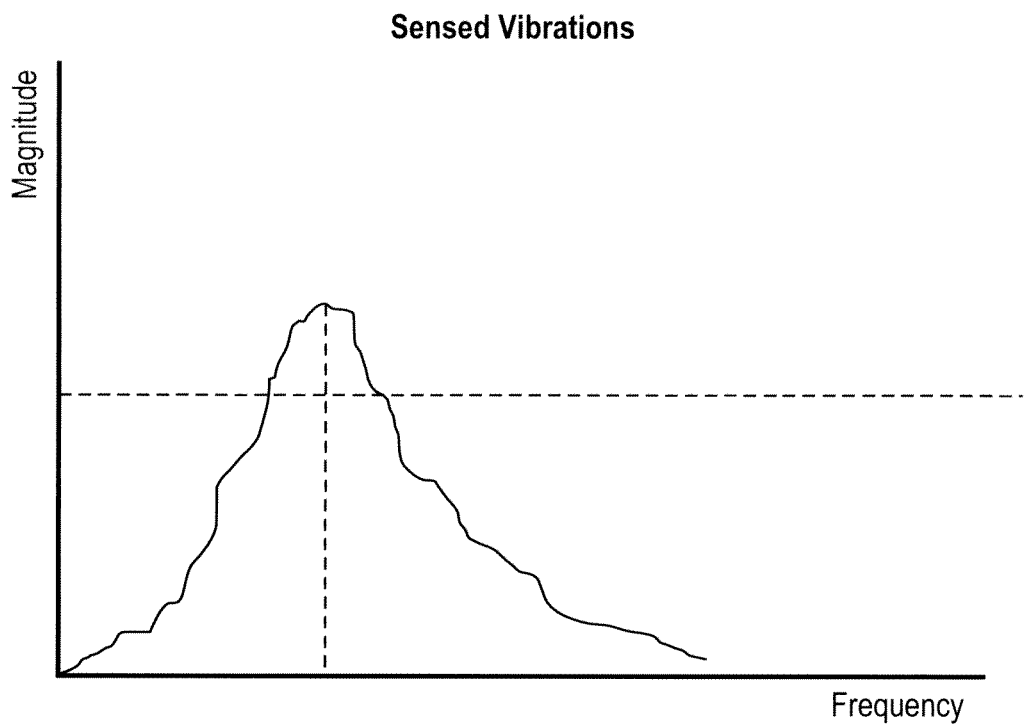
FIG. 3B is a frequency domain representation of example vibrations sensed in the portable audio device while the device is held in the hand of the user.

As shown in FIG. 3A, the magnitude of a peak in the frequency spectrum is below the predetermined level. Upon detecting that the peak is below the predetermined level, the context detector module 8 makes a determination that the device 1 is lying steady or still on a fixed surface or otherwise not being held in the hand of a user. This is in contrast to what is shown in FIG. 3B, where the magnitude of a peak in the frequency spectrum of the sensed vibrations is above the predetermined level. Upon detecting that peak is above the predetermined level, the context detector module 8 may make a determination that the device 1 is being held in the hand of a user. Other environmental inputs may be considered, e.g. proximity sensor output, when making the context decision that the device 1 is being held in the user's hand versus lying still and flat on a fixed surface. In one embodiment, an inclination reading from an inclinometer separate from the motion sensor 7 is used by the context detector module 8 to assist in determining whether the device 1 is being held in the user's hand or lying still and flat on a fixed example, if the inclinometer reports an inclination above a particular degree (e.g. 30°), the context detector module 8 may view this as strong evidence that the device 1 is being held in the hands of a user. In another embodiment, face detection may be used to assist in determining whether the device 1 is being held in the hand of a user. For example, if a face is detected by an integrated camera the device 1 is likely being held in the hand of a user.

Based on the determination by the context detector module 8, either upward or downward tilt equalization is applied to an audio signal to be output through the speaker 2. In one embodiment, upward tilt equalization is applied to the audio signal when the device 1 is determined to be held in the hand of a user by the context detector module 8 while downward tilt equalization is applied to the audio signal when the device 1 is determined to be lying flat on a fixed surface (and not being held in the hand of a user) by the context detector module 8. In other embodiments, different equalizations may be applied to the audio signal based on the context detector module 8. In one embodiment, equalization may be performed by one or more of the audio codec 17, the processor 6, the memory 4, and a set of hardware logic structures (e.g. filters, arithmetic logic units, dedicated state machines, and Fast Fourier Transform processors). For example, equalization may be performed by an audio equalizer integrated in the audio codec 17.

Figure 4A:
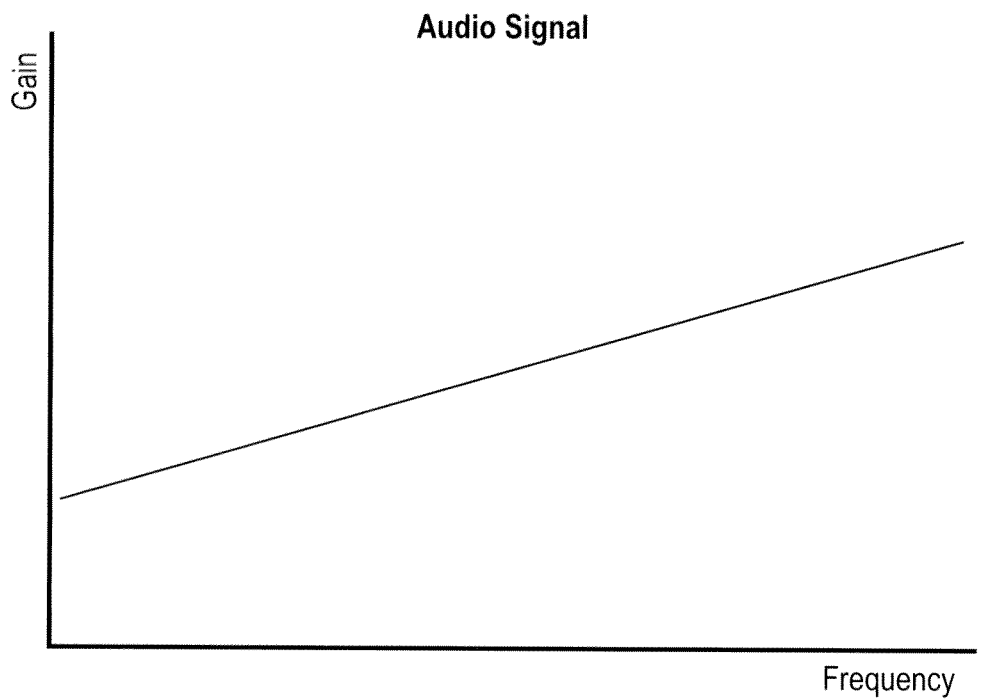
FIG. 4A shows a gain response chart representing upward tilt equalization.

Upward tilt equalization may be defined as applying more gain at higher frequencies of the audio signal than at lower frequencies. FIG. 4A shows a gain to frequency chart representing upward tilt equalization. As shown, the level of gain slowly increases as the chart moves to higher frequencies. Although shown as a linear progression, the level of gain applied to an audio signal may be logarithmic, exponential, or another non-linear progression.

Figure 4B:
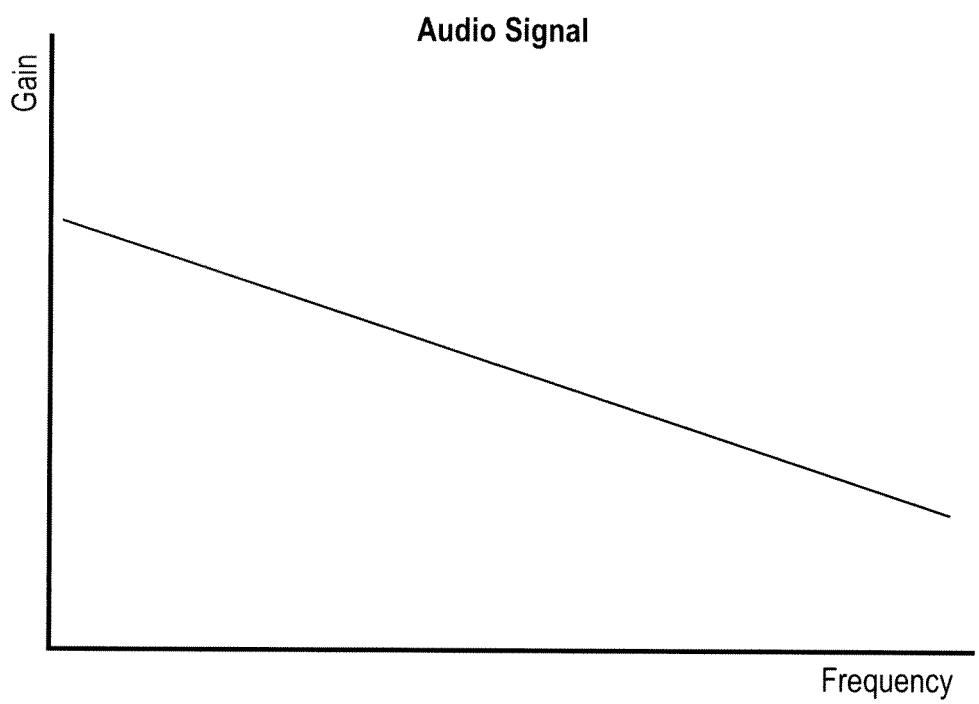
FIG. 4B shows a gain response chart representing downward tilt equalization.

Downward tilt equalization may be defined as applying more gain at lower frequencies of the audio signal than at higher frequencies. FIG. 4B shows a gain to frequency chart representing downward tilt equalization. As shown, the level of gain slowly decreases as the chart moves to higher frequencies. Although shown as a linear progression, the level of gain applied to an audio signal may be logarithmic, exponential, or another non-linear progression.

By detecting the context or positioning of the device 1 and applying audio equalization accordingly, audio emitted by the device 1 through the speaker 2 is more consistent and more accurately represents the audio signal. For example, applying downward tilt equalization to an audio signal when the portable device 1 whose speaker output is located on its edge (rather than on its top or bottom face) is lying flat on a table eliminates or abates an apparent "brightness" in the sound emitted by the speaker, where such undesired brightness may be caused by sound wave diffraction, reflection off nearby surfaces, reverberation, and similar deformations off the surface of the table.

As explained above, an embodiment of the invention may be a machine-readable medium (such as microelectronic memory) having stored thereon instructions, which program one or more data processing components (generically referred to here as a "processor") to perform the operations described above. In other embodiments, some of these operations might be performed by specific hardware components that contain hardwired logic (e.g., dedicated state machines). Those operations might alternatively be performed by any combination of programmed data processing components and fixed hardwired circuit components.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. The description is thus to be regarded as illustrative instead of limiting.

What is claimed is:

1. A method within a portable audio device, comprising:
    sampling output data of a motion sensor that is integrated in the portable audio device while the device is outputting an audio signal through an integrated speaker in a speakerphone mode;
    determining, based on the sampled output data of the motion sensor, whether the portable audio device is being held;
    applying a first audio equalization to the audio signal when the portable audio device is being held, and outputting the audio signal, with the first audio equalization applied, through the integrated speaker in speakerphone mode; and
    applying a second, different audio equalization to the audio signal when the determination is that the portable device is not being held, and outputting the audio signal, with the second audio equalization applied, through the integrated speaker in speakerphone mode.

2. The method of claim 1, wherein determining whether the portable audio device is being held comprises:
    converting the sampled output data of the motion sensor to frequency domain;
    detecting a magnitude of a peak in a predetermined frequency range in the frequency domain; and
    determining that the portable audio device is being held when the detected magnitude is greater than a predetermined level.

3. The method of claim 1, wherein determining whether the portable audio device is being held is based on the sampled output data of the motion sensor and sample data from an inclinometer separate from the motion sensor.

4. The method of claim 1, wherein the motion sensor is one of an accelerometer and a gyroscope.

5. The method of claim 2, wherein the predetermined frequency range is 10-20 Hz.

6. The method of claim 1, wherein the first audio equalization comprises an upward tilt equalization.

7. The method of claim 6, wherein the second audio equalization comprises a downward tilt equalization.

8. The method of claim 1, wherein the second audio equalization comprises a downward tilt equalization.

9. A method within a portable audio device, comprising:
    sampling output data of a motion sensor that is integrated in the portable audio device while the device is outputting an audio signal through an integrated speaker while in speakerphone mode;
    determining, based on the sampled output data of the motion sensor, whether the portable audio device is lying still on a fixed surface or being held in a hand of a user based on detected involuntary hand movements in the sampled output data;
    applying a first audio equalization to the audio signal when the portable audio device is lying still on the surface and is in speakerphone mode; and
    applying a second, different audio equalization to the audio signal when the determination is that the portable device is being held in the hand of the user and is in speakerphone mode.

10. The method of claim 9, wherein the first audio equalization comprises a downward tilt equalization.

11. The method of claim 10, wherein the second audio equalization comprises an upward tilt equalization.

12. The method of claim 9, wherein the second audio equalization comprises a downward tilt equalization.

13. A portable audio device comprising:
    a mobile communications device housing;
    a speaker installed in the housing to receive an audio signal;
    an audio equalizer to process the audio signal prior to receipt by the speaker;
    a motion sensor installed in the housing; and
    a context detector installed in the housing and coupled to the motion sensor, the context detector to analyze a sampled data output signal of the motion sensor to detect (a) when the housing is not lying still against a surface, and in response signal the audio equalizer to apply upward tilt audio equalization to the audio signal prior to output through the speaker while in speakerphone mode, and (b) when the device is lying still against a surface and in response signal the audio equalizer to apply downward tilt audio equalization to the audio signal prior to output through the speaker while in speakerphone mode.

14. The portable audio device of claim 13, wherein the context detector is to:
    transform the sampled data output signal of the motion sensor to frequency domain,
    detect a magnitude of a peak in a predetermined frequency range in the frequency domain, and
    determine that the portable audio device is not lying still against a surface when the detected magnitude is greater than a predetermined level.

15. The portable audio device of claim 13, wherein the motion sensor is one of an accelerometer and a gyroscope.

16. The portable audio device of claim 13, wherein the audio equalizer applies upward tilt audio equalization to the audio signal by one of raising gain for the audio signal at a set of high frequencies that are higher than a set of low frequencies, or lowering gain for the audio signal at the set of low frequencies.

17. The portable audio device of claim 13, wherein the audio equalizer applies downward tilt audio equalization to the audio signal by one of raising gain for the audio signal at a set of low frequencies that are lower than a set of high frequencies, or lowering gain for the audio signal at the set of high frequencies.

18. An article of manufacture, comprising:
a non-transitory machine-readable storage medium that stores instructions which, when executed by a processor in a portable audio device,
receive data of a motion sensor while the device is outputting an audio signal through a speaker in speakerphone mode,
analyze the data of the motion sensor to detect the portable audio device is being held or the device is lying still and flat against a surface,
apply upward tilt audio equalization to the audio signal being output through the speaker in speakerphone mode when the analyzed data indicates the device is being held, and
apply downward tilt audio equalization to the audio signal being output through the speaker in speakerphone mode when the analyzed data indicates the device is lying still and flat against the surface.

19. The article of manufacture of claim 18, wherein the storage medium includes further instructions which, when executed by the processor, transform the motion sensor data to frequency domain, detect a magnitude of a peak in a predetermined frequency range in the frequency domain, and determine that the portable audio device is being held when the detected magnitude is greater than a predetermined level.

20. The article of manufacture of claim 18, wherein the motion sensor data is one of accelerometer data and gyroscope data.

21. The article of manufacture of claim 18, wherein the instructions define the upward tilt audio equalization as one of raising gain for the audio signal at a set of high frequencies that are higher than a set of low frequencies, or lowering gain for the audio signal at the set of low frequencies.

22. The article of manufacture of claim 18, wherein the instructions define the downward tilt audio equalization as one of raising gain for the audio signal at a set of low frequencies that are lower than a set of high frequencies, or lowering gain for the audio signal at the set of high frequencies.

23. A portable audio device comprising:
a mobile communications device housing;
a loudspeaker installed in the housing to receive an audio signal;
an audio equalizer to process the audio signal prior to receipt by the loudspeaker;
a motion sensor installed in the housing; and
a context detector installed in the housing and coupled to the motion sensor, the context detector to analyze a sampled data output signal of the motion sensor to
(a) detect when the housing is being held by (i) transforming the sampled data output signal of the motion sensor to frequency domain, (ii) detecting a magnitude of a peak in a predetermined frequency range in the frequency domain, and (iii) determining that the housing is being held when the detected magnitude is greater than a predetermined level, and in response signal the audio equalizer to apply upward tilt audio equalization to the audio signal prior to output through the loudspeaker, and
(b) detect when the device is not being held, and in response signal the audio equalizer to apply downward tilt audio equalization to the audio signal prior to output through the loudspeaker.

24. The portable audio device of claim 23, wherein the motion sensor is one of an accelerometer and a gyroscope.

25. The portable audio device of claim 23, wherein the audio equalizer applies upward tilt audio equalization to the audio signal by one of raising gain for the audio signal at a set of high frequencies that are higher than a set of low frequencies, or lowering gain for the audio signal at the set of low frequencies.

26. The portable audio device of claim 23, wherein the audio equalizer applies downward tilt audio equalization to the audio signal by one of raising gain for the audio signal at a set of low frequencies that are lower than a set of high frequencies, or lowering gain for the audio signal at the set of high frequencies.

* * * * *